(12) United States Patent
Lee et al.

(10) Patent No.: US 7,843,732 B2
(45) Date of Patent: Nov. 30, 2010

(54) METHODS OF OPERATING MULTI-BIT FLASH MEMORY DEVICES AND RELATED SYSTEMS

(75) Inventors: Su-Ryun Lee, Gyeonggi-do (KR); Song-Ho Yoon, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 153 days.

(21) Appl. No.: 12/201,476

(22) Filed: Aug. 29, 2008

(65) Prior Publication Data

US 2009/0073762 A1    Mar. 19, 2009

(30) Foreign Application Priority Data

Aug. 30, 2007    (KR) ...................... 10-2007-0087783

(51) Int. Cl.
  *G11C 16/00*    (2006.01)
  *G11C 16/04*    (2006.01)
  *G11C 16/06*    (2006.01)

(52) U.S. Cl. ............................ 365/185.09; 365/185.03; 365/185.18

(58) Field of Classification Search .............. 365/185.09
See application file for complete search history.

(56) References Cited

U.S. PATENT DOCUMENTS

2002/0039311 A1*    4/2002    Takeuchi et al.    ........ 365/185.09
2008/0049496 A1*    2/2008    Abraham    ............... 365/185.03

FOREIGN PATENT DOCUMENTS

| JP | 2000-132995 | 5/2000 |
| KR | 1019990077597 A | 10/1999 |
| KR | 1020060048803 A | 5/2006 |
| KR | 1020060056440 A | 5/2006 |

* cited by examiner

*Primary Examiner*—Huan Hoang
*Assistant Examiner*—James G Norman
(74) *Attorney, Agent, or Firm*—Myers Bigel Sibley & Sajovec, P.A.

(57) ABSTRACT

Methods of operating a non-volatile multi-bit memory device can include programming multi-bit memory cells included in one page of the device with page data including an error detection code based on the page data and determining the validity of the page data using the error detection code read from the multi-bit memory cells in response to an error during programming of the multi-bit memory cells, wherein the multi-bit memory cells in the one page are configured to store a single bit of the page data.

18 Claims, 11 Drawing Sheets

| MSB\LSB | 0 | 1 |
|---|---|---|
| 0 | 00<br>10<br>01 | 01<br>11 |
| 1 | 00<br>10<br>01 | 11 |

(a) 2-bit per 1-cell (CONVENTIONAL ART)

| MSB\LSB | 0 | 1 |
|---|---|---|
| 0 | X | 01<br>11 |
| 1 | 00<br>10<br>01 | 11 |

(b) 1-bit per 1-cell

Fig. 9

METHODS OF OPERATING MULTI-BIT FLASH MEMORY DEVICES AND RELATED SYSTEMS

CROSS-REFERENCE TO RELATED APPLICATIONS

This U.S. non-provisional patent application claims priority under 35 U.S.C. §119 to Korean Patent Application No. 10-2007-0087783, filed on Aug. 30, 2007, the entire contents of which are hereby incorporated by reference.

FIELD OF THE INVENTION

The present invention disclosed herein relates to a semiconductor memory device, and more particularly, to a flash memory system and a data management method thereof.

BACKGROUND

The flash memory can be divided into a NOR flash memory and a NAND flash memory depending on connection states of a memory cell and a bit line. The NOR flash memory may have a fast read speed but a slow write speed, such that it is typically used as a code memory. Additionally, since the NAND flash memory has a fast write speed and has a low cost per unit area, it is generally used as a high capacity data storage. If comparing the flash memory with other memory devices, the flash memory can provide a fast read speed with a relatively low unit cost. However, erase operation is performed before writing data therein and the data unit to be erased is larger than data unit to be written in the flash memory. These characteristics may make the flash memory more difficult to be used as a main memory, and may also make it more difficult for a file system of a general hard disk to be used if the flash memory is used as an auxiliary memory device.

Accordingly, in order to hide an erase operation of the flash memory, a flash translation layer (FTL) between a file system and a flash memory may be used. During a write operation of the flash memory, the FTL can map a logical address generated from a file system into a physical address of a flash memory where an erase operation is performed. During a write operation of a flash memory, the FTL can map a logical address generated from a file system into a physical address of a flash memory where an erase operation is performed. The FTL may utilize an address mapping table in order to perform fast address mapping. Due to the address mapping of the FTL, a host can recognize a flash memory device as a hard disk drive (or, SRAM) and then accesses a flash memory device through the same method as a hard disk drive. The FTL may be realized in a form of a hardware separated from a host system, or in a form of a device drive inside a host system.

Moreover, a flash memory device may face a situation where re-booting may be needed due to serious errors during operations. The most typical situation is an unexpected power failure (e.g., a black out). When a power failure occurs, all memory blocks may be scanned after re-booting in order to read mapping information stored in a specific region within each memory block, and then a mapping table is constructed in SRAM. However, if a power failure occurs during a program operation, it may be difficult to determine a programmed state of a memory cell (i.e., whether a memory cell is normally programmed or not).

SUMMARY

Embodiments according to the present invention provide can provide methods of operating multi-bit flash memory devices and related systems. Pursuant to these embodiments, a method of operating a non-volatile multi-bit memory device can include programming multi-bit memory cells included in one page of the device with page data including an error detection code based on the page data and determining the validity of the page data using the error detection code read from the multi-bit memory cells in response to an error during programming of the multi-bit memory cells, wherein the multi-bit memory cells in the one page are configured to store a single bit of the page data.

DESCRIPTION OF EMBODIMENTS ACCORDING TO THE INVENTION

The present invention is described more fully hereinafter with reference to the accompanying drawings, in which embodiments of the invention are shown by way of example. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

It will be understood that when an element is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. Like numbers refer to like elements throughout. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

The present invention may be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout the drawings. Hereinafter, a NAND flash memory device is used as one example in order to describe features and functions of the present invention. Additionally, the present invention may be applied to all multi-bit flash memory devices, but only 2-bit multi-level cell (MLC) is used herein for concise description.

Korean Pat. No. 2006-0056440 entitled "DEVICE AND METHOD OF PROCESSING DATA OF FLASH MEMORY" discusses a technique to determine validity of data, when power fails during programming of the device, which is incorporated herein by reference. As appreciated by the present inventors, the above-referenced technique may not be easily applied to a multi-bit flash memory device.

Figure 1:
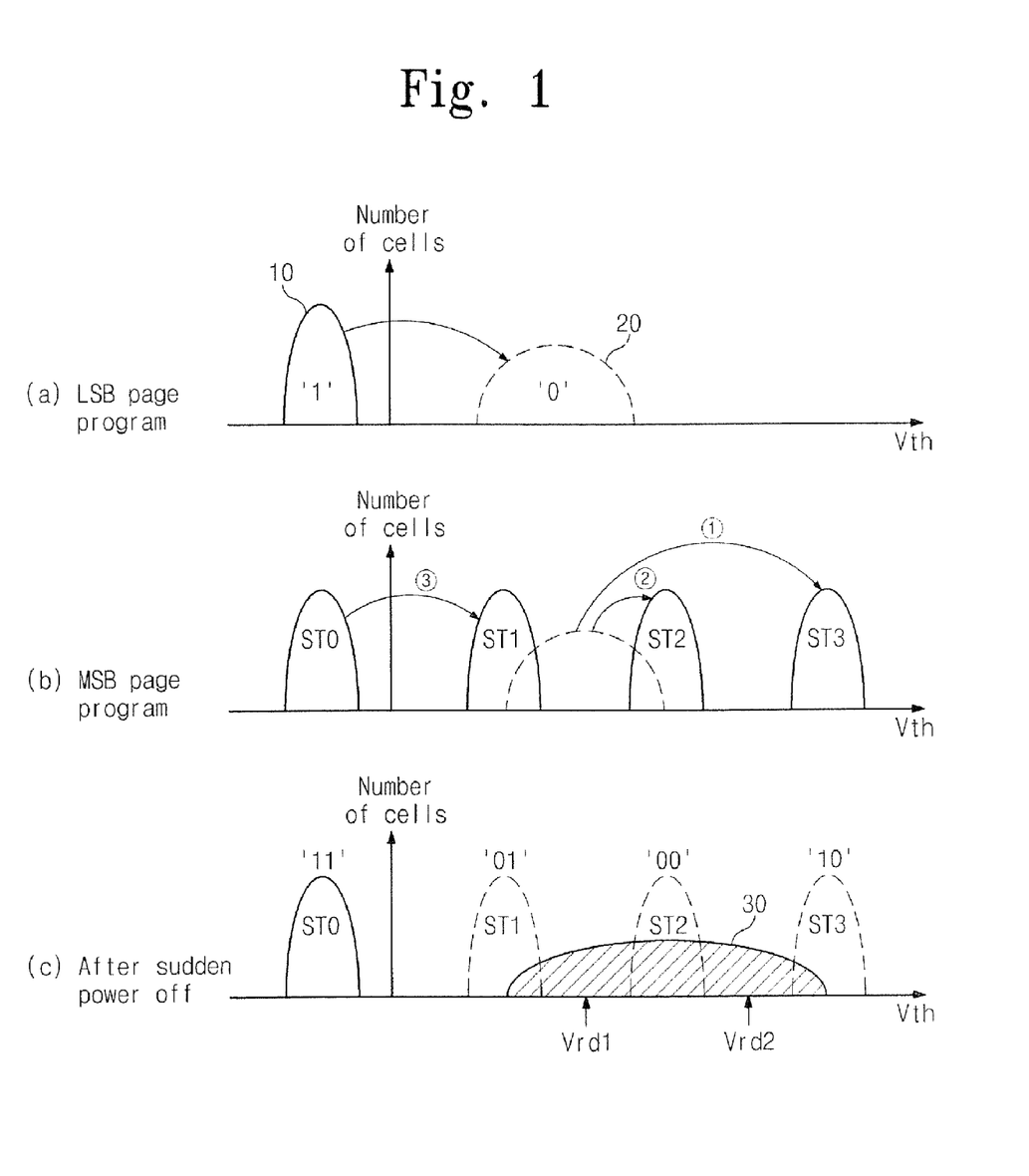
FIG. 1 is a view illustrating various states of a flash memory after sudden power off.

FIG. 1 is a view illustrating a programming order of a multi-level cell (MLC) or a multi-bit flash memory device including the same and various limitations after sudden power off. Referring to FIG. 1, during a program operation of the MLC, a least significant bit (LSB) is programmed first, and then a most significant bit (MSB) is programmed. As illustrated in operation (a), through an LSB page program, a memory cell shifts from an erase state 10 (corresponding to data '1') into a program state 20 (corresponding to data '0'), or maintains the erase state 10. Thereafter, through an MSB program in operation (b), a threshold voltage of a memory cell corresponds to one of threshold voltage distributions ST0, ST1, ST2, and ST3.

During an MSB page program, states with a high threshold voltage are programmed first. That is, a programming order of an MSB page includes programming from the threshold voltage state 20 into a threshold voltage state ST3 ①, programming from the threshold voltage state 20 into a threshold voltage state ST2 ②, and then finally programming the threshold voltage state '1' into a threshold voltage state ST1 ③.

As appreciated by the present inventors, if a power failure occurs during a programming operation of an MSB page, state uncertainties of the current MSB page and also previously-programmed LSB page may increase. In operation (c), the threshold voltage distribution 30 represents a cell potential state when a power supply is interrupted during the MSB page program after the LSB page is programmed into '0'. At this point, a threshold voltage of a memory cell corresponds to one level of the distribution 30. If data of a page in the middle of programming is read after a power failure occurs, it is recognized as a multi-bit data corresponding to one of threshold voltage states ST1, ST2, and ST3 according to read voltages (e.g., Vrd1 or Vre2). However, even if target data is in threshold voltage states ST2 and ST3 during the MSB page program, there may be memory cells of which a recognized threshold voltage corresponds to the threshold voltages state ST1. These memory cells are read as '1' even if their LSB page data are '0'. This limitation may not be easily resolved by simply reprogramming only the MSB page. Furthermore, even if power supply is interrupted during the MSB page program, the MSB page program may be normally completed. In this case, if an MSB page is determined as not being programmed and an LSB page data is read, a valid LSB data may be recognized as an invalid value.

Figure 2:
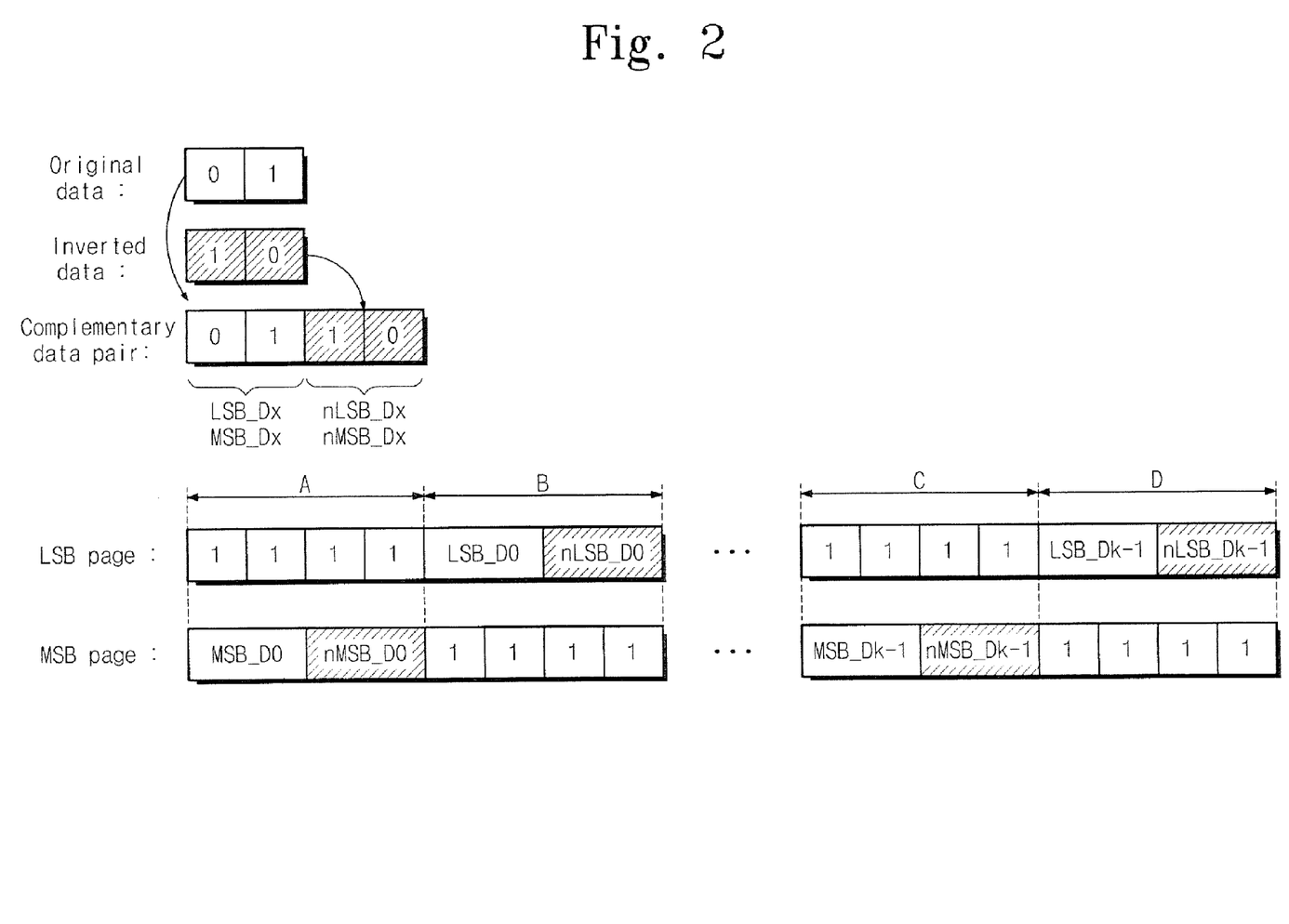
FIG. 2 is a view illustrating methods of rearranging program data in some embodiments according to the present invention.

FIG. 2 is a view illustrating a programming method in some embodiments according to the invention. Referring to FIG. 2, program data are divided into segments of a predetermined bit unit before being programmed into a cell array. All bits in each of the divided segments are respectively inverted in order to create an inverted data with the same number of bits. The divided bit unit and the inverted bit unit constitute a complementary data pair. Each complementary data pair is inserted by a predetermined bit interval in one page unit to be programmed. That is, one page (i.e., LSB or MSB page) to be programmed is divided into a bit interval maintained in an erase state and a bit interval to which a complementary data pair is allocated. Program data at the bit interval of the erase state is set with 1. This setting of a page to be programmed will be described in more detail below.

In some exemplary embodiments according to the invention, a data structure of pages to be programmed through one program cycle includes an LSB page and an MSB page. First, in relation to the LSB page, bit intervals A and C are erase segment intervals maintained as an erase state. Bit intervals B and D are locations to which a complementary data pair including original data segment and inverted data segment is allocated. In relation to the bit interval B, a complementary data pair LSB_D0 and nLSB_D0 includes one data LSB_D0 among the divided bit units and its inverted data nLSB_D0. In relation to the bit interval D, a complementary data pair LSB_Dk-1 and nLSB_Dk-1 includes one data LSB_Dk-1 among the divided bit units and its inverted data nLSB_Dk-1.

Through this method, within an LSB page, a complementary data pair including original data LSB_Dx and its inverted data nLSB_Dx is inserted between erase segments maintained in an erase state. The number of bits of the complementary data pair may be the same as that of the erase segment. However, the number of bits of erase segment is not limited to embodiments of the present invention.

Meanwhile, a structure of an MSB page to be programmed into memory cells (e.g., memory cells connected to the same word line) where the LSB page is programmed is as follows. Complementary data pairs MSB_Dx and nMSB_Dx to which meaningful data are programmed are allocated to column addresses of the bit intervals A and C corresponding to the erase segments of the LSB page. However, within the LSB page, an erase segment '1111' of the MSB page is allocated to column address intervals corresponding to the bit intervals B and D to which the complementary data pairs are already-programmed. As a result, according to settings of the LSB and MSB pages of the present invention, meaningful 1-bit data is programmed in each of the multi-bit flash memory cells.

As appreciated by the present inventors, one page to be programmed includes a complementary data pairs having original data and its inverted data. Each of the erase segments between the complementary data pairs has the same number of bits as the complementary data pair. In order to program multi-bit data, the complementary data pairs of the MSB page are allocated to a column address interval to which erase segments are allocated in the LSB page. Through settings of multi-page data allocated to memory cells sharing the same word line, already-programmed LSB page may be less affected even if a power failure occurs. Additionally, uncertainty caused by a power failure can be reduced. These effects may be described in more detail below. At the point of power failure, validity of data can be accurately determined according to whether the complementary relationship between complementary data pairs read from a re-booted memory device is maintained or not. Referring to FIG. 2, although a case where each of the complementary data pairs and the erase segments has 4-bit size is described as an example, the present invention is not limited thereto. That is, the number of bits of the complementary data pair and the erase segment can be arbitrarily selected.

Furthermore, the determination of the validity of page data is not limited to a method of utilizing the above-described complementary data pair of FIG. 2. For example, an error detection code such as parity or cyclic redundancy checking (CRC) may be used for determining the validity data. An LSB page and an MSB page are set to place data, to which the error detection code is applied, between erase segments, and only meaningful 1-bit data is programmed in each of the multi-bit flash memory cells. Hereinafter, the complementary data pairs through the error detection code are used for describing features of the present invention.

As described above, in some embodiments according to the invention, subsets of column locations in one page of the multi-bit memory cells are programmed with target data whereas other subsets of column locations in the same page are "erased" to provide an alternating patterns of target data interspersed with erased data. Further, each of the other pages of the multi-bit cell can be programmed according to a similar alternating pattern of target data and erased data. Moreover, the patterns programmed into each of the pages can be offset from one another so that one page is programmed with target data whereas the remaining pages are erased. For example, as shown in FIG. 2, the erased data in the LSB page and in the MSB page are in different column locations (i.e., offset from one another) so that each mult-bit location stores target data (or the complement of target data) and erased data. As appreciated by the present inventors, storing a single bit of target data with an erased state in the same cell can reduce the number of unknown states that can result when power is lost when programming, for example, the MSB page. In particular, the flash memory cell is normally "erased" to store a "1" as the MSB. Therefore, if programming is interrupted while erasing the MSB, the threshold value may be corrupted. Accordingly, the memory controller may more readily determine that the MSB has been corrupted due to the power loss. Further, the complementary data pair can also take advantage of this same relationship as any data written to the LSB page will include a "1" value (either because the target data is "1" or the complement of the target data is "1"). In either case, if power is interrupted during programming so that the threshold voltage is incorrectly set, the complementary relationship may not be maintained due to the fact that the erase state in either of the data bits included in the pair may be corrupted.

Figure 3:
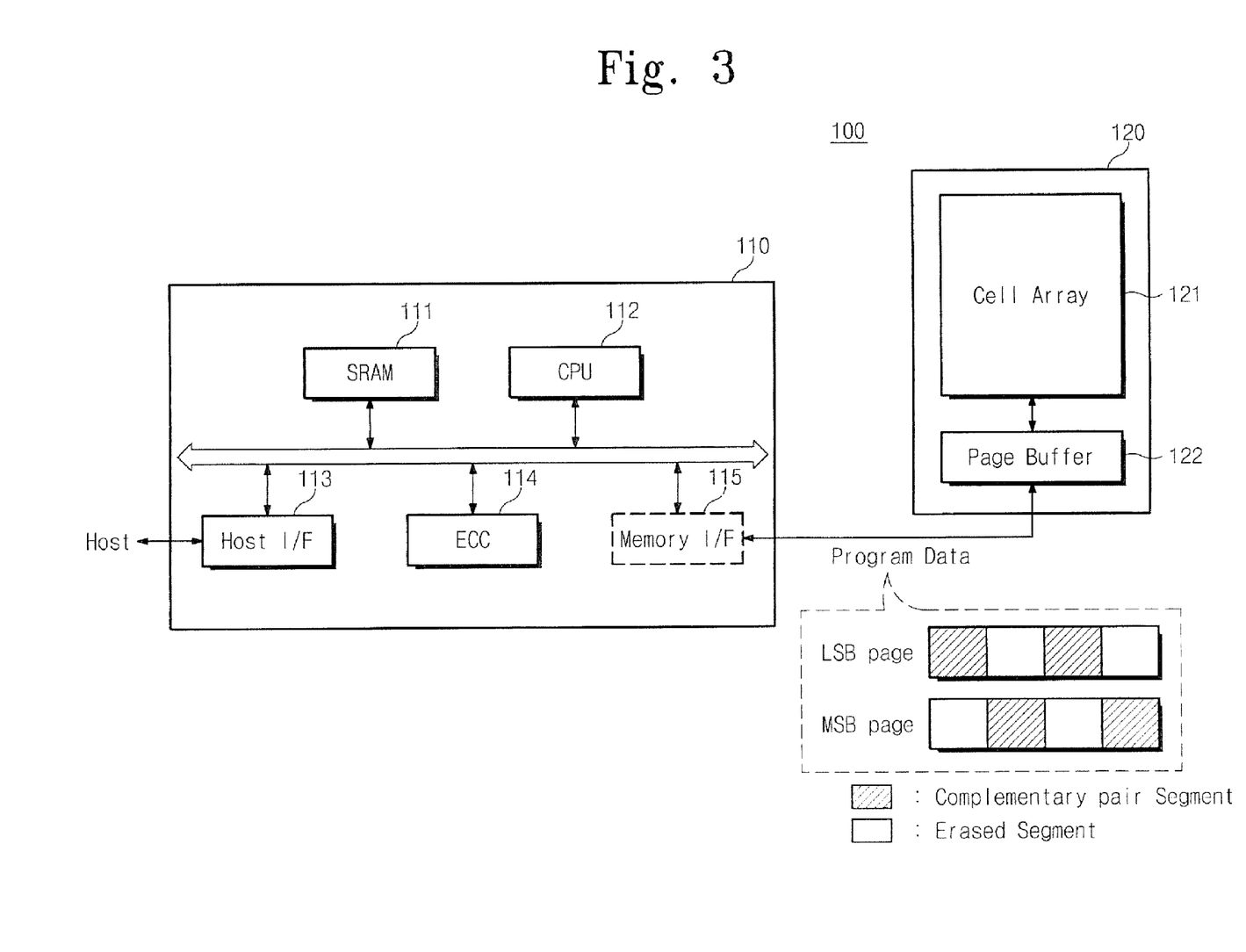
FIG. 3 is a block diagram of a memory system in some embodiments according to the present invention.

FIG. 3 is a block diagram of a memory system 100 according to the present invention. Referring to FIG. 3, the memory system 100 includes a memory controller 110 and a flash memory device 120. The memory controller 110 rearranges program data through the method of FIG. 2 according to an algorithm corresponding to a flash translation layer (FTL). Additionally, at the point of power failure during programming, the memory controller 110 determines whether data is valid or not according to a procedure defined in the FTL. More detailed description will be made below.

The memory controller 110 faces a situation where data are programmed into the flash memory device 120 according a request from a host or data management sequence. Then, the memory controller 110 creates program data through complementary data pairs or other error detection codes according to the method of FIG. 2. The memory controller 110 sets a column address to place complementary data pairs between erase segments in order to rearrange a page unit. The memory controller 110 controls the flash memory device 120 for programming program data of the rearranged page unit. The flash memory device 120 programs the program data into an LSB page or an MSB page according to a control of the memory controller 110.

If a power failure occurs during a program operation, the memory controller 110 refers to an address mapping table to confirm page data according to a FTL algorithm, which are in the middle of programming before a power failure occurs. By calling a page address of the confirmed program data, the memory controller 110 reads page data in the middle of programming at the point of power failure. Complementary data pairs are extracted from the read MSB page or LSB page and it is determined whether the complementary relationship of the complementary data pairs is maintained or not. According to a determination result of the complementary relationship, validity of page data is determined according to whether the complementary relationship is satisfied or not. Additionally, it is determined whether a reprogram operation is performed or not according to the determined validity.

To determine the above validity, the memory controller 110 includes SRAM 111, a central processing unit (CPU) 112, and an error correcting code (ECC) 114. Additionally, the memory controller 110 further includes a host interface (I/F) 113 for interfacing with a host and a memory interface (I/F) 115 for interfacing with the flash memory device 120. Although not explicitly illustrated in the drawings, the memory system 100 of the present invention may further include ROM storing code data for interfacing with a host. Furthermore, the memory system 100 may be applied to the flash memory device that is directly connected to a bus without passing through the memory I/F 115. Additionally, the method of allocating program data according to the present invention may be applied to a fusion memory such as an One NAND flash memory.

The memory controller 110 is merely one example for describing features of the present invention. That is, a file system or a software module in OS of a host can rearrange program data through the method of FIG. 2 and determines the validity of the program data. In this case, even if without a structure of the memory controller 110, the programming of data and determining of validity according to the present invention can be accomplished. That is, the memory controller 110 may be substituted with a software or hardware module in a host.

In a word, at the point of power failure during a program operation, the memory system 100 is re-booted and searches general states prior to a power failure occurrence. The memory system 100 determines whether the data in the middle of programming when a power source occurs is valid or not. Then, the memory controller 110 reads the page data in the middle of programming at the point of power failure according to a FTL algorithm. A complementary data pair is extracted from the read page data to determine whether a complementary relationship is maintained or not. Additionally, it is determined that the page data maintaining a complementary relationship is valid if the complementary relationship is maintained, and if not, it is determined that the page data are not valid.

Figure 4:
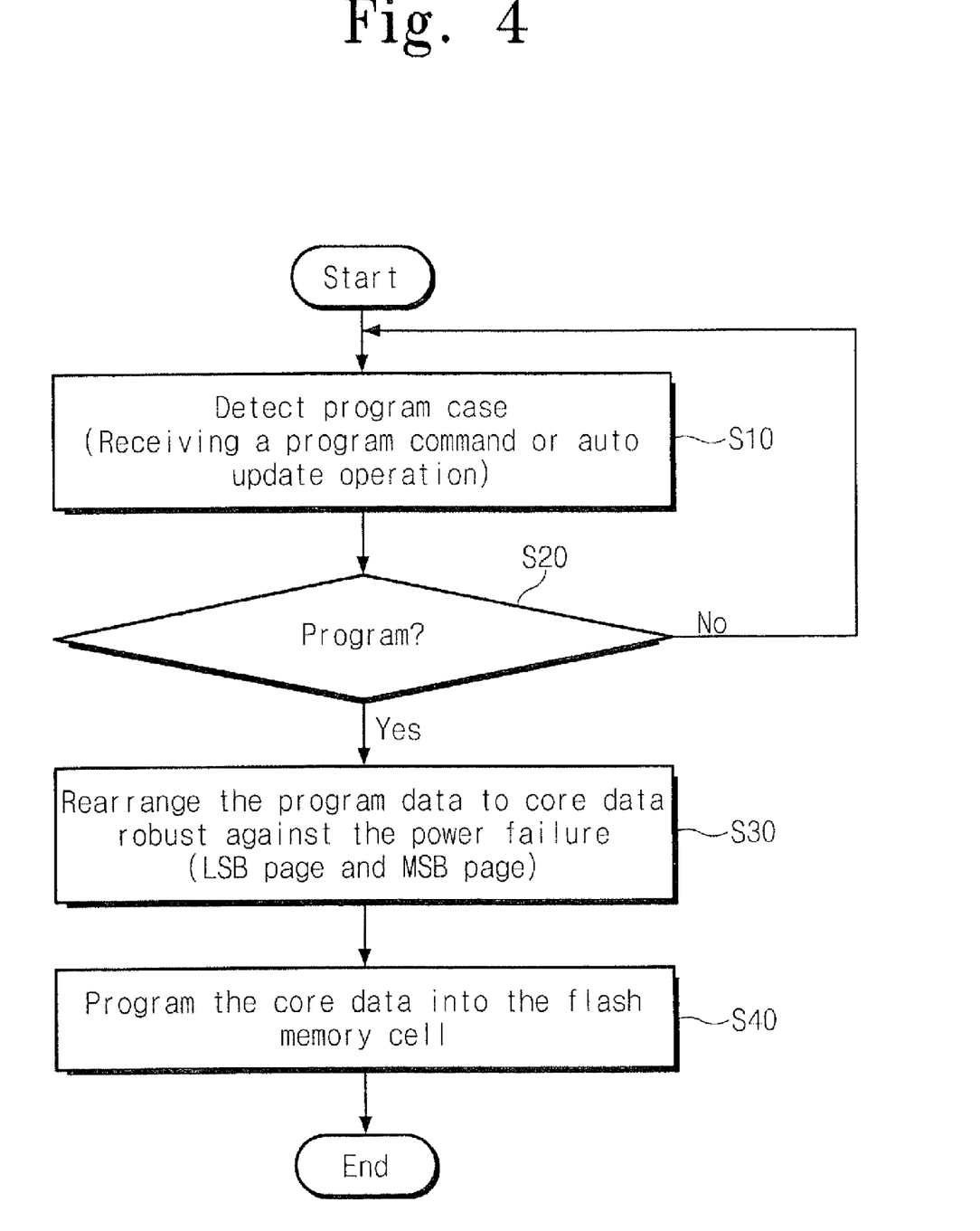
FIG. 4 is a flowchart illustrating programming methods in some embodiments according to the present invention.

FIG. 4 is a flowchart illustrating a program operation of the present invention performed by the memory controller 110 of FIG. 3. Referring to FIG. 4, explained is a programming method of the present invention capable of minimizing the influence between an MSB page and an LSB page and accurately determining whether data are valid or not even if a power failure occurs.

The memory controller 110 monitors program conditions for performing a program operation according to an external request or its own determination in operation S10. If the monitoring result meets the program conditions for programming data in operation 20, it proceeds to operation S30 for rearranging the program data to core data. On the contrary, if the monitoring result does not meet the program conditions, it stands by until the program condition is satisfied in operation S20.

If the program conditions for programming data are satisfied, the memory controller 110 rearranges the program data according to the method of FIG. 2. The program data may be data which is provided from a host or data for updating which is generated in the memory controller 110. Generally, control information for main data such as meta data or an error code is stored in a spare area. In a case where the control information is stored in the spare area, the control information is created in the memory controller 110 for attachment. The program data are divided by a predetermined bit unit, and pairs of the divided predetermined bit units and their inverted bit units constitute complementary data pairs, respectively. The complementary data pairs are rearranged in order to be inserted between erase segments corresponding to an erase state. At this point, the program data programmed into the MSB page rearranges the MSB page according to the method of FIG. 2. That is, a page is rearranged to allow a column address interval allocated to an erase segment in the LSB page to be allocated with a complementary data pair in an MSB page. On the contrary, a page is rearranged to allow a column address interval allocated with a complementary data pair to be allocated with erase segments in an MSB page. As a result, each of the rearranged page data loses a number of bits proportional to the number consumed in erase segments for programming. When considering the number of bits allocated to inverted data, program bit efficiency (the number of meaningful bits/programmable bits) is just merely 25%. However, because this gives sufficient performance improvement in a case of a power failure occurrence, it may be useful in situations where high data reliability is desired.

Next, the memory controller 110 loads page data into a page buffer 122, and then provides program commands and program data to the flash memory device 120 in order to program the data in a cell array 121. In response to a command, the flash memory device 120 programs an LSB page or an MSB page in selected word lines in operation S40. Here, if it is normally programmed, general program operations are completed.

However, if a power failure occurs during the programming of the core data in operation S40, the memory controller 110 follows procedures defined by the FTL in order to perform a determine operation for validity. General procedures for valid determination will be described in more detail with reference to FIG. 5. According to the programming method including each operation, even if a power failure occurs during a program operation of an MSB page, its effect is minimally applied to already-programmed LSB page. Because meaningful 1-bit data are allocated to one memory cell, even if a power failure occurs, probability for becoming invalid data will be drastically reduced. Additionally, validity of an LSB page or an MSB page can be accurately determined through complementary data pairs.

Figure 5A:
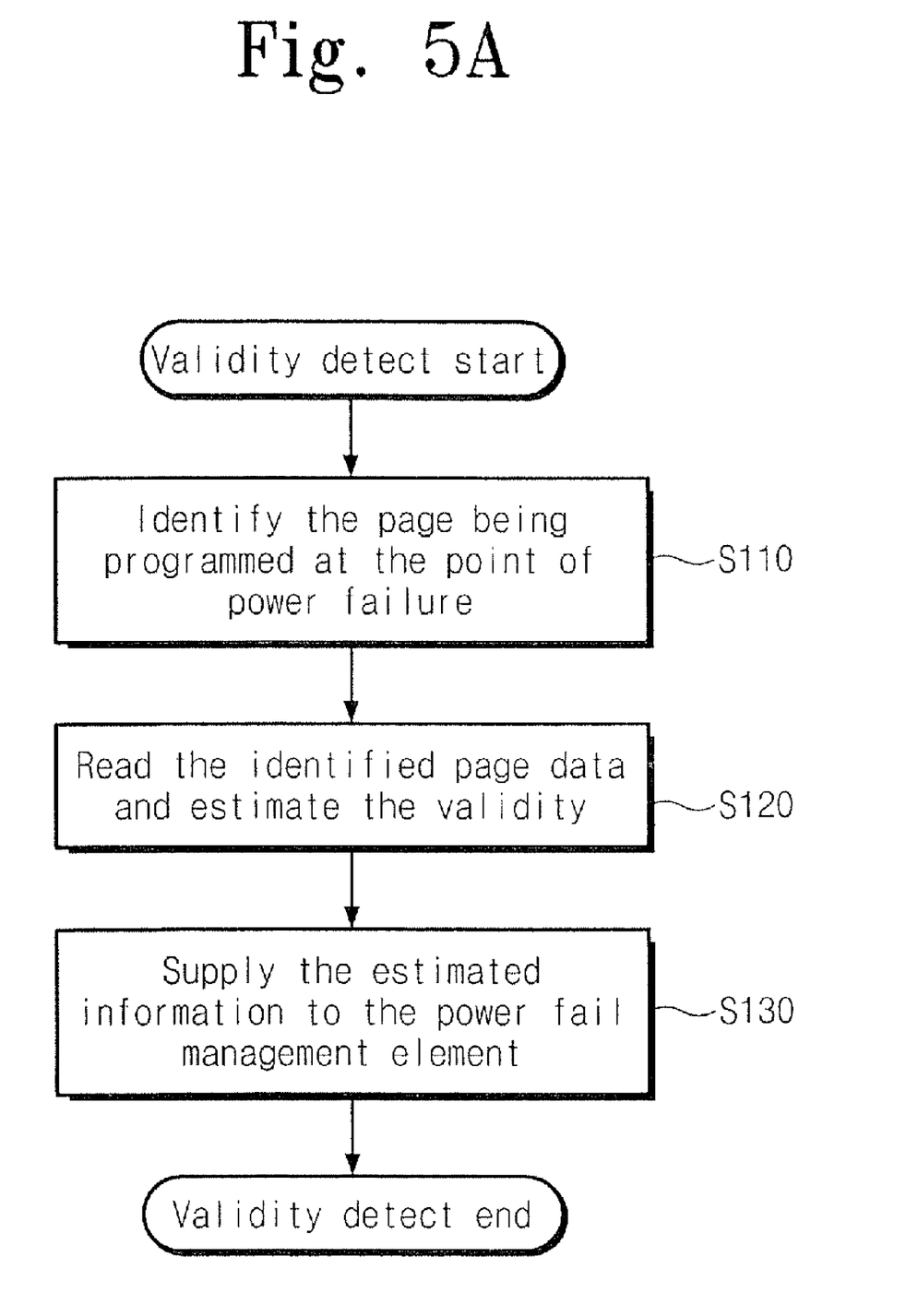
FIG. 5A is a flowchart illustrating methods of determining validity of data at the point of power failure in some embodiments according to the present invention.
Figure 5B:
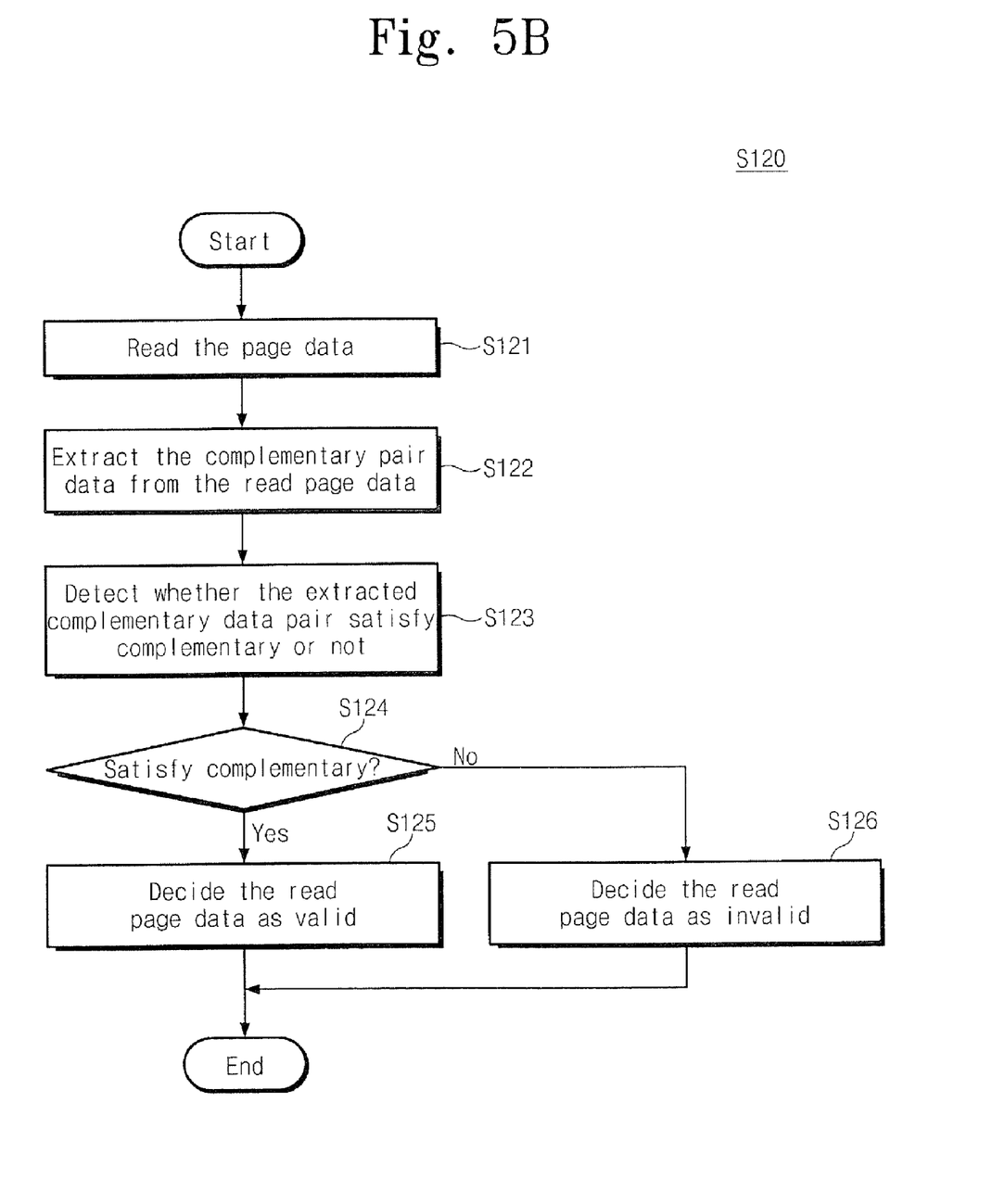
FIG. 5B is a flowchart illustrating a method of estimating validity of the data of FIG. 5A in some embodiments according to the present invention.

FIGS. 5A and 5B are flowcharts illustrating an operation of determining data validity at the point of power failure during the program operation of FIG. 4. That is, FIG. 5A illustrates an operation of determining whether programmed data is valid or not through the FTL at the point of power failure according to the present invention. FIG. 5B is a flowchart illustrating a method of estimating validity of programmed data.

Referring to FIG. 5A, if a power failure occurs, the memory system 100 is re-booted or reset. According to a FTL algorithm, the memory system 100 calls a page address, which is in the middle of programming at the point of power failure. This operation may be accomplished through the scanning of a flash memory device or the recovering of an address mapping table in operation S110. The memory controller 110 reads a page that is in the middle of programming at the point of power failure by referring to the called page address. The read page data may be an MSB page or an LSB page. However, through the rearranging of a page according to the present invention, the already-programmed LSB page is less affected even if a power failure occurs during a program operation of an MSB page. Accordingly, an operation of confirming whether a page in the middle of programming is an LSB page or an MSB page at the point of power failure is useless in operation S120. Estimated information derived from validity evaluation is transferred to a power failure management element (not shown) in operation S130. Once the estimated information is provided, a detect operation for validity is finished.

According to the validity evaluation for data in the middle of programming at the point of power failure, only one read operation is used for evaluating the validity of data. That is, according to a program method for storing 1-bit data in one memory cell, already-programmed LSB page data are minimally affected even if a power failure occurs. Accordingly, even if a power failure occurs during a program operation of an MSB page, determining of validity for an LSB page in the same word line may not be needed. Consequently, a method of programming data and a method of determining the validity of data according to the present invention can reduce error occurrence probability and accurately determine the validity of data even if a power failure occurs during a program operation.

Referring to FIG. 5B, detailed operations for reading and determining the validity of data in the middle of the program operation at the point of power failure in operation S120 of FIG. 5A will be described. First, the page data in the middle of programming at the point of power failure are read in operation S121. The read page data includes erase segments and complementary data pairs. Accordingly, the erase segments are discarded and the complementary data pairs are extracted from the read page data in operation S122. In operation S123, it is determined whether the extracted complementary data pairs have complementarity or not. According to a determination result in operation S124, if the complementary data pairs satisfy the complementarity, it is determined that a page in the middle of programming is normally programmed even if a power failure occurs in operation S125. However, if any one of the extracted complementary data pairs does not satisfy the complementarity, the page in the middle of programming at the point of power failure is determined as invalid in operation S126. In this case, the invalid page needs to be reprogrammed through the FTL procedures.

It will be understood that the term "complementarity" includes situations where the data and the complementary data stored as the complementary data pair are the logical opposite of one another. For example, for a complementary data pair to have "complementarity," the data and the complementary data included in the pair are the logical opposite of one another. Alternatively, if the data and the complementary data included in the pair are not the logical opposite of one another (e.g., logically equal) the data pair is said to not have complementarity.

According to the validity determination of FIGS. 5A and 5B, it is determined whether data is valid or not regardless of whether a page in the middle of programming at the point of power failure is an MSB page or an LSB page. That is, even if a power failure occurs during a program operation of an MSB page, the already-programmed LSB page is minimally affected according to the programming method of the present invention.

Figure 6:
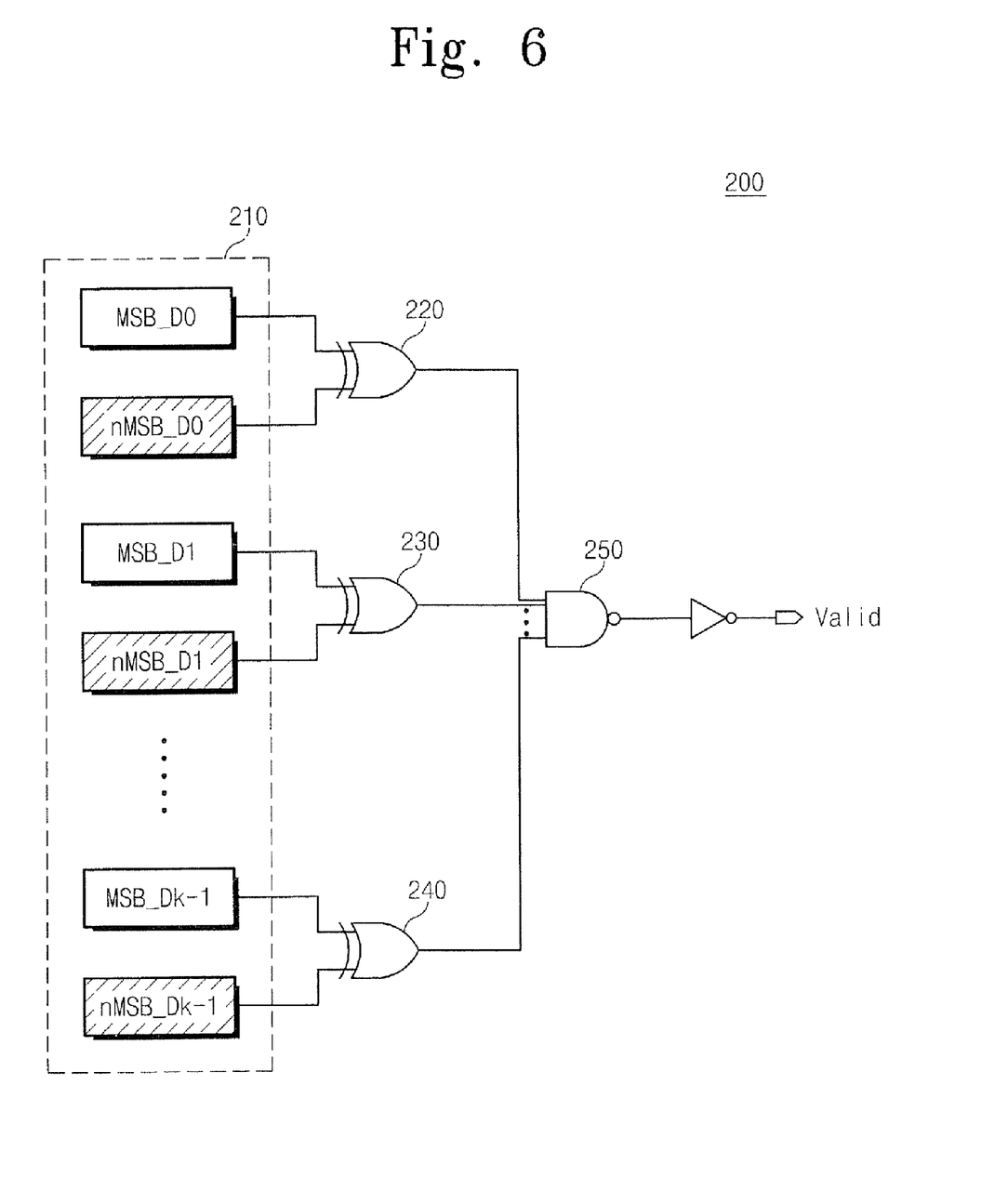
FIG. 6 is a circuit diagram illustrating a method of determining whether complementary data segment is valid or not in some embodiments according to the present invention.

FIG. 6 is a view for illustrating a method of determining whether each complementary data pair is valid or not. Referring to FIG. 6, a structure of logic gates for determining of data validity if an MSB page is read is illustrated. Original data and its inverted data in a complementary data pair 210 extracted from the read page are inputted into XOR gates, respectively. Through this method, it is determined whether the complementary data pair 210 maintains complementarity or not. If all the complementary data pair 210 maintains the complementarity in an MSB page, outputs of all XOR gates are logic "HIGH". In this case, a determination signal Valid indicating the validity of data is outputted as logic "HIGH". On the contrary, if there is at least one bit having broken complementarity in the complementary data pair, a corresponding XOR gate outputs a logic "LOW". Consequently, the determination signal Valid becomes logic "LOW" to indicate that the read data is not valid.

The above-described logic circuit for determining whether a page data is valid or not according to the complementarity maintenance is merely an exemplary structure, in order to visibly illustrate a method of detecting the validity according to the present invention. It is apparent to those skilled in the art that software for algebraic operations, which corresponds to the above logic circuit, can also detect the validity of complementary data pairs.

Figure 7A:
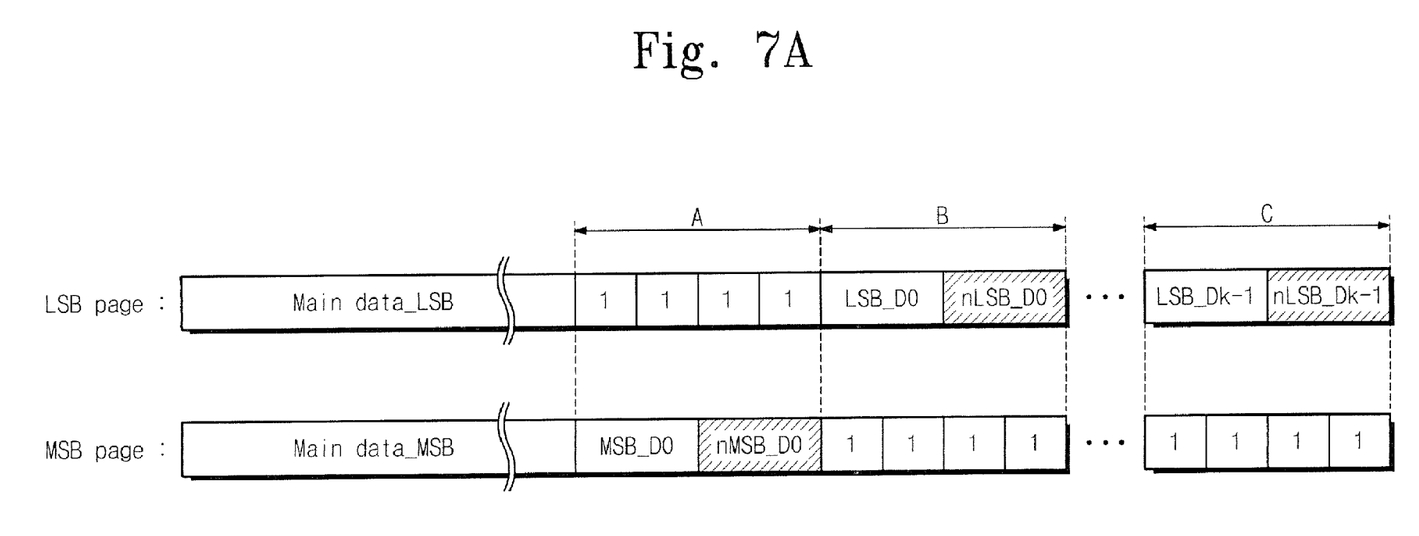
FIG. 7A is a view illustrating program data rearrangement in some embodiments according to the present invention.
Figure 7B:
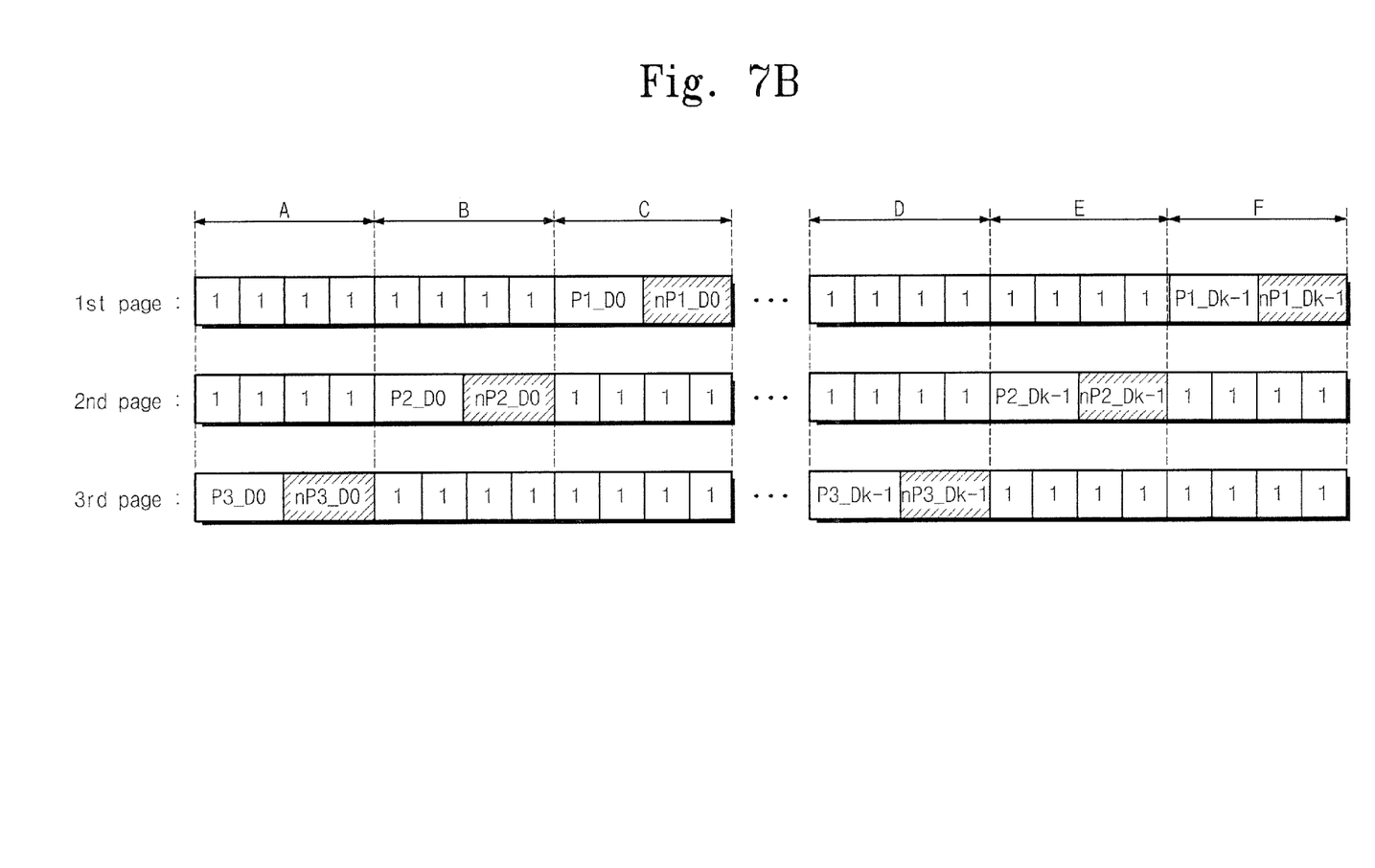
FIG. 7B is a view illustrating program data rearrangement in some embodiments according to the present invention.

FIGS. 7A and 7B are views illustrating a program method according to another embodiment of the present invention.

Referring to FIG. 7A, the page structure of FIG. 2 is partially applied to an interval in one page. For example, control information (e.g., error code and meta data) of data to be programmed may be programmed through the method of FIG. 2. That is, complementary data pairs can be inserted between erase segments in each multi-bit page where high reliability data is desired. If a power failure occurs, validity of a spare region including control information for main data can be promptly determined. Therefore, this prompt determination can be used for power failure restoration.

FIG. 7B is a view for illustrating an embodiment where the present invention is applied to at least 3-bit MLC. The 2-bit MLC flash memory device is used as an example in FIG. 2, but the present invention is not limited thereto. According to the 3-bit MLC flash memory device of FIG. 7B, each page includes a basic unit of one complementary data pair and two erase segments. For example, in a first page 1st page, erase segments are allocated to column address intervals A and B. Complementary data pair P1_D0 and nP1_D0 is allocated to a column address interval C. According to this arrangement order, program data constitutes a first page 1st page. In a second page 2nd page, erase segments are allocated to column address intervals A and C. A complementary data pair P2_D0 and nP2_D0 is allocated to a column address interval B. In a third page 3rd page, erase segments are allocated to column address intervals B and C. A complementary data pair P3_D0 and nP3_D0 is allocated to the column address interval A. Looking at only the column address intervals A, B, and C, at the second and third pages 2nd page and 3rd page, erase segments are allocated to the column address interval C where the complementary data pair P1_D0 and nP1_D0 is allocated at the first page 1st page. Likewise, erase segments are allocated to the column address interval B in the first and third pages 1st page and 3rd page, where a complementary data pair P2_D0 and nP2_D0 is allocated in the second page 2nd page. Erase segments are allocated to the column address interval A in the first and second pages 1st page and 2nd page, where a complementary data pair P3_D0 and nP3_D0 is allocated in the third page 3rd page. As a result, meaningful 1-bit data is programmed into one memory cell through these page structures. That is, even if a plurality of pages are programmed, each of the memory cells connected to the same word line stores only the 1-bit data corresponding to each complementary data pair. Here, an address allocation order of a complementary data pair is illustrated as column address intervals (C->B->A), but this is merely one embodiment of the present invention. An example of 3-bit MLC is described above, but it is apparent that this page structure can be applied to more than 4-bit MLC.

If power or other various program failures occur, the above embodiments provide fundamental foundation that can be effectively used for determining whether a page in the middle of programming is valid or not. Additionally, the influence between multi-bit pages corresponding to the same word line can be prevented during a program operation through a page structure of the present invention. Therefore, reliability of data can be enhanced.

Figure 8:
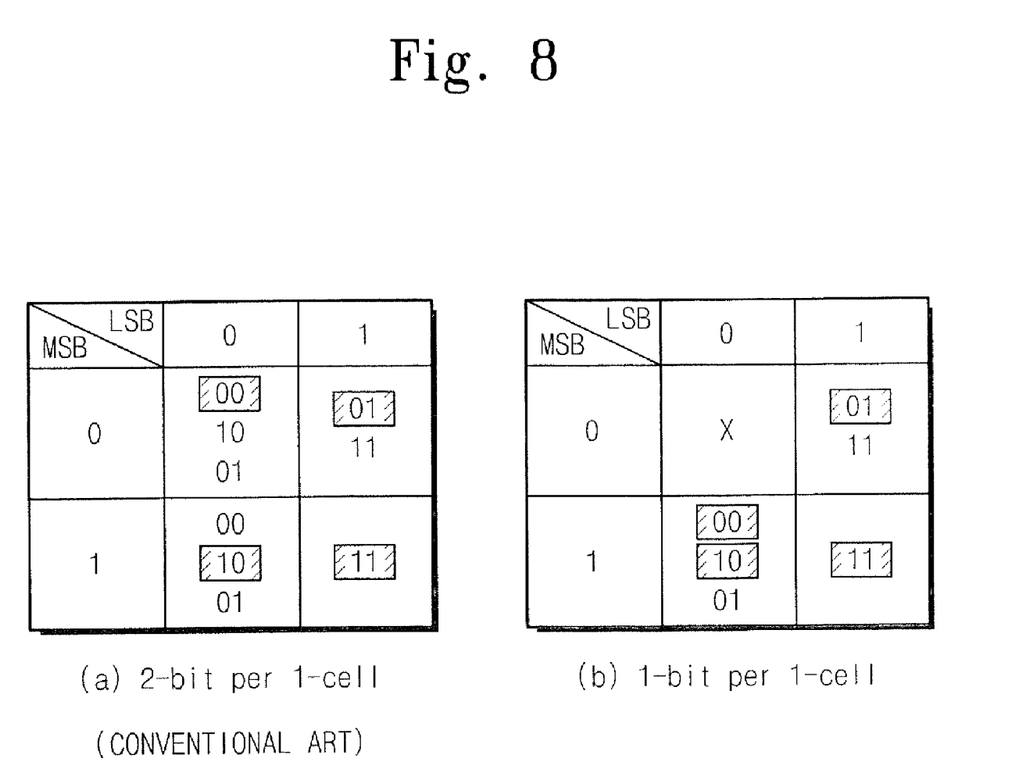
FIG. 8 is a view illustrating additional results according to program data rearrangement in some embodiments according to the present invention.

FIG. 8 illustrates additional results according to the rearrangement per page of program data according to the present invention, Table 8(a) illustrates a number of cases about data states that a 2-bit memory cell can have at the point of a power failure according to a conventional art in which one memory cell stores 2-bit data. Table 8(b) illustrates a number of cases about data states that one memory cell can have at the point of power failure according to a program operation of the present invention.

Referring to Table 8(a), in a case where LSB is programmed with 0, if a power failure occurs during MSB programming, a memory cell has a threshold voltage corresponding to one of data 00, 10, and 01. If MSB in the middle of programming is 0, target data is 00, and if MSB in the middle of programming is 1, target data is 10. However, a memory cell may have a threshold voltage corresponding to one of three data states due to a power failure as shown in FIG. 1. If the already-programmed LSB is 1, the memory cell may have a threshold voltage corresponding to one of data 01 and 11 if a power failure occurs. The hatched data in Table 8(a) represents that MSB is normally programmed. Accordingly, if a power failure occurs during the programming of MSB in a conventional art in which 2-bit data is programmed into one memory cell, probability of maintaining a valid state corresponds to 4 out of 9.

Table 8(b) represents a number of cases where valid 1-bit data is stored in one memory cell. According to the present invention, any one of LSB and MSB is logic 1 based on allocation of erase segments. Therefore, data 00 does not exist where LSB and MSB are simultaneously 0. This condition is indicated with X in Table 8(b). According to this condition, even if a power failure occurs during a program operation of MSB, probability that a memory cell is to be normally programmed is increased. Even if a power failure occurs during a program operation of MSB, in a case where a memory cell is programmed into a target state, four cases corresponding to 01, 00, 10, and 11 exist among a total number of cases, i.e., six cases. Accordingly, compared to a case where 2-bit is programmed into one memory cell, more stability can be achieved. Moreover, reliability of data to be programmed is enhanced, and probability for being determined as valid data also is increased.

According to the above-described programming method of the present invention, due to the existence of an erase segment, there is no possibility that LSB and MSB of one memory cell have 0 simultaneously. Accordingly, even if a power failure occurs, probability for determining the data as valid is increased. Moreover, provided is accurate data information for determining data validity through a structure of a complementary data segment.

Figure 9:
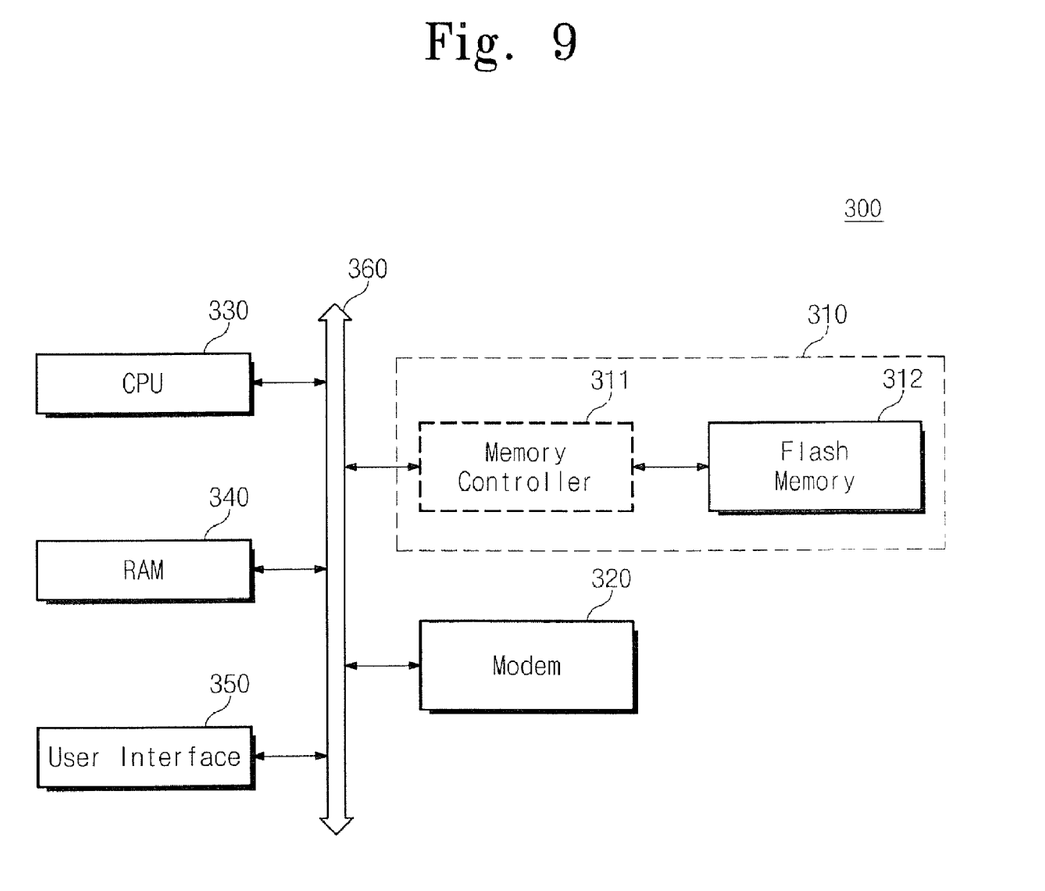
FIG. 9 is a block diagram of an information processing system in some embodiments according to the present invention.

FIG. 9 is a block diagram of an information processing system 300 with a memory system 30. Referring to FIG. 9, the flash memory system 310 of the present invention is mounted on the information processing system 300 such as a mobile devices or desktop computers. The information processing system 300 includes the flash memory system 310, a modem 320, a CPU 330, a RAM 340, and a user interface 350, which are connected through a system bus 360. The flash memory system 310 has the same structure as the memory system 100 of FIG. 3. The flash memory system 310 stores data provided through an input/output device (not shown) or data processed by the CPU 330. If a power failure occurs during a program operation, the information processing system 300 is re-booted, and the memory system 310 determines whether program data at the point of power failure is valid or not. Especially, the memory controller 311 receives and reads a page address allocated during a final program operation, and then determines whether data is valid or not according to a determining method of the present invention. Therefore, a method of storing valid 1-bit data in one multi-bit memory cell provides a multi-bit flash memory system less susceptible to a power failure. It is apparent to those skilled in the art that the memory controller 311 may be substituted with a hardware or software module in a host.

Here, the flash memory system 310 may include a semiconductor disk device (SSD). Although not illustrated in the drawings, it is apparent to those skilled in the art that the information processing system 300 of the present invention may further include an application chipset, a camera image processor (CIS), a mobile DRAM, etc.

Moreover, the flash memory device and/or the memory controller according to the present invention can be mounted through various forms of packages. For example, the various forms of packages include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP). wafer-level processed stack package (WSP), etc.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of operating a non-volatile multi-bit memory device comprising:
   programming multi-bit memory cells included in one page of the device with page data including an error detection code based on the page data, and
   determining validity of the page data using the error detection code read from the multi-bit memory cells in response to an error during programming of the multi-bit memory cells, wherein the multi-bit memory cells in the one page are configured to store a single bit of the page data, wherein a plurality of pages are programmed with page data configured in alternating patterns of program and cormplimentary program data interspersed with erased data within rows of the plurality of pages.

2. The method of claim 1, wherein the error detection code comprises program data and complementary program data, wherein the complementary data is targeted to include inverted program data.

3. The method of claim 2, wherein determining validity comprises comparing the program data to the complementary program data read from the page to determine a complementary relationship therebetween.

4. The method of claim 3, wherein the complementary program data is allocated to a first subset of column locations in the page of the multi-bit memory and erased data is allocated to a second subset of column locations in the page immediately adjacent to the first subset is in an erased state.

5. The method of claim 4, wherein the second subset of column locations in remaining pages of the non-volatile memory device include a single occurrence of second program data and second complementary program data and the second subset of column locations in a balance of the remaining pages includes erased data.

6. The method of claim 5, wherein a number of the first and second subsets of column locations are equal.

7. The method of claim 2, wherein determining validity comprises:
reading the page data from the multi-bit memory cells to provide read page data;
extracting the complementary program data from the read page data; and
determining if a complementary relationship exists between program data and the complementary program data.

8. The method of claim 7, wherein if the complementary relationship does not exist the page data is indicated as invalid.

9. The method of claim 2, wherein the complementary data corresponds to control information about main data in the one page.

10. The method of claim 9, wherein the control information is meta data.

11. The method of claim 1, wherein the error detection code comprises a parity code, check sum code, and/or a cyclic redundancy checking code.

12. The method of claim 1, wherein the error comprises a power failure occurring during programming.

13. The method according to claim 1 wherein the alternating patterns of program and complimentary program data in adjacent rows of the plurality of pages are offset from one another.

14. A memory system for operating a non-volatile multi-bit memory device comprising:
a controller module configured to determine validity of page data stored in a page of the device using error detection code read from multi-bit memory cells in response to an error during programming of the multi-bit memory cells, wherein the multi-bit memory cells are configured to store a single bit of the page data, wherein the controller module is configured to allow data to correspond to an erase state in the pages except for one page, the data being in a column address range into which the complementary data is programmed.

15. The memory system of claim 14, wherein the error comprises a power failure occurring during programming of the page.

16. The memory system of claim 14, wherein the controller module is configured to determine validity by comparing program data to complementary program data read from a row of the page to determine a complementary relationship therebetween.

17. The memory system of claim 16, wherein the complementary program data is allocated to a first subset of column locations in the page of the multi-bit memory and erased data is allocated to a second subset of column locations in the page immediately adjacent to the first subset is in an erased state 18. The memory system of claim 16, wherein the controller module is configured to read the page data to provide read page data and to extract the complementary program data from the read page data and to determine if a complementary relationship exists between program data and the complementary program data.

* * * * *